(12) United States Patent
Inoue et al.

(10) Patent No.: US 8,915,657 B2
(45) Date of Patent: Dec. 23, 2014

(54) OPTO-ELECTRIC HYBRID BOARD AND MANUFACTURING METHOD THEREFOR

(75) Inventors: Masami Inoue, Ibaraki (JP); Masayuki Hodono, Ibaraki (JP); Akiko Nagafuji, Ibaraki (JP); Yuichi Tsujita, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 80 days.

(21) Appl. No.: 13/413,802

(22) Filed: Mar. 7, 2012

(65) Prior Publication Data

US 2012/0251036 A1 Oct. 4, 2012

Related U.S. Application Data

(60) Provisional application No. 61/473,556, filed on Apr. 8, 2011.

(30) Foreign Application Priority Data

Mar. 29, 2011 (JP) ................................. 2011-073619

(51) Int. Cl.
| | |
|---|---|
| G02B 6/36 | (2006.01) |
| G02B 6/122 | (2006.01) |
| H05K 1/02 | (2006.01) |
| G02B 6/42 | (2006.01) |

(52) U.S. Cl.
CPC ..... *G02B 6/42* (2013.01); *G02B 6/122* (2013.01); *H05K 1/0274* (2013.01); *G02B 6/4214* (2013.01); *G02B 6/4231* (2013.01); *H05K 2201/10121* (2013.01)
USPC ............................................. 385/91; 385/90

(58) Field of Classification Search
CPC .... G02B 6/4214; G02B 6/4219; G02B 6/426; G02B 6/4261
USPC ...................................................... 385/90, 91
See application file for complete search history.

(56) References Cited

U.S. PATENT DOCUMENTS

| | | | | |
|---|---|---|---|---|
| 4,756,590 | A | * | 7/1988 | Forrest et al. .................... 385/89 |
| 5,125,054 | A | * | 6/1992 | Ackley et al. .................... 385/49 |

(Continued)

FOREIGN PATENT DOCUMENTS

| | | |
|---|---|---|
| JP | 5-196831 A | 8/1993 |
| JP | 2005-037870 A | 2/2005 |

OTHER PUBLICATIONS

Chinese Office Action dated Sep. 3, 2014, issued in counterpart Chinese Patent Application No. 201210055293.4, w/English translation (16 pages).

(Continued)

*Primary Examiner* — Rhonda Peace
(74) *Attorney, Agent, or Firm* — Westerman, Hattori, Daniels & Adrian, LLP (57) ABSTRACT

Provided are an opto-electric hybrid board and a manufacturing method therefor. The opto-electric hybrid board includes an optical waveguide unit and an electric circuit unit having an optical element mounted thereon, the electric circuit unit being coupled to the optical waveguide unit using coupling pins. The optical waveguide unit includes fitting holes for fitting the coupling pins thereinto, which are formed in a surface of an overcladding layer, located and formed at predetermined locations with respect to one end surface of a core. The electric circuit unit includes fitting through holes for fitting the coupling pins therethrough, located and formed at predetermined locations with respect to the optical element. The optical waveguide unit and the electric circuit unit are coupled to each other in a state in which the coupling pins fit through the fitting through holes and fit into the fitting holes.

4 Claims, 7 Drawing Sheets

(56) References Cited

U.S. PATENT DOCUMENTS

| | | | |
|---|---|---|---|
| 5,519,803 A * | 5/1996 | Shiono et al. | 385/132 |
| 5,999,670 A * | 12/1999 | Yoshimura et al. | 385/31 |
| 6,034,808 A * | 3/2000 | Isaksson | 359/245 |
| 6,144,795 A * | 11/2000 | Dawes et al. | 385/141 |
| 6,389,202 B1 * | 5/2002 | Delpiano et al. | 385/49 |
| 6,406,196 B1 * | 6/2002 | Uno et al. | 385/89 |
| 6,869,229 B2 * | 3/2005 | Reedy et al. | 385/88 |
| 6,934,450 B2 * | 8/2005 | Hiramatsu | 385/52 |
| 7,036,999 B2 * | 5/2006 | Schrodinger | 385/88 |
| 7,063,467 B2 * | 6/2006 | Nagasaka et al. | 385/88 |
| 7,221,829 B2 * | 5/2007 | Oono et al. | 385/52 |
| 7,239,767 B2 * | 7/2007 | Kim et al. | 385/14 |
| 7,316,512 B2 * | 1/2008 | Shih et al. | 385/93 |
| 7,373,033 B2 * | 5/2008 | Lu et al. | 385/14 |
| 7,995,875 B2 * | 8/2011 | Yasuda et al. | 385/14 |
| 8,031,993 B2 * | 10/2011 | Bowen | 385/38 |
| 8,055,105 B2 * | 11/2011 | Hodono | 385/14 |
| 8,315,491 B2 * | 11/2012 | Hino et al. | 385/31 |
| 2002/0051599 A1 * | 5/2002 | Tsukamoto et al. | 385/14 |
| 2002/0131727 A1 * | 9/2002 | Reedy et al. | 385/88 |
| 2004/0114866 A1 * | 6/2004 | Hiramatsu | 385/39 |
| 2004/0234210 A1 * | 11/2004 | Nagasaka et al. | 385/88 |
| 2005/0025435 A1 * | 2/2005 | Miyamae | 385/88 |
| 2005/0100264 A1 * | 5/2005 | Kim et al. | 385/14 |
| 2006/0215963 A1 | 9/2006 | Hamano | |
| 2007/0140615 A1 * | 6/2007 | Tanaka et al. | 385/31 |
| 2007/0297713 A1 * | 12/2007 | Lu et al. | 385/14 |
| 2009/0269704 A1 * | 10/2009 | Hodono | 430/319 |
| 2010/0142904 A1 * | 6/2010 | Yanagisawa | 385/131 |
| 2011/0134679 A1 * | 6/2011 | Suh et al. | 365/64 |
| 2011/0235964 A1 * | 9/2011 | Masuda et al. | 385/14 |
| 2012/0219251 A1 * | 8/2012 | Kuroda et al. | 385/14 |
| 2012/0251036 A1 * | 10/2012 | Inoue et al. | 385/14 |

OTHER PUBLICATIONS

Japanese Office Action dated Nov. 4, 2014, issued in Japanese Patent Application No. 2011-073619, w/English translation (5 pages).

* cited by examiner

OPTO-ELECTRIC HYBRID BOARD AND MANUFACTURING METHOD THEREFOR

RELATED APPLICATIONS

This application claims the benefit of U.S. Provisional Application No. 61/473,556 filed on Apr. 8, 2011, which is hereby incorporated by reference.

BACKGROUND OF THE INVENTION

1. Field of the Invention

The present invention relates to an opto-electric hybrid board which includes an optical waveguide unit and an electric circuit unit having an optical element mounted thereon, and a manufacturing method therefor.

2. Description of the Related Art

In recent electronic devices or the like, as the amount of transmission information increases, in addition to electric wiring, optical wiring is adopted. More specifically, an opto-electric hybrid board including an electric circuit unit in which an optical element such as a light-emitting element for converting an electrical signal into an optical signal or a light-receiving element for converting an optical signal into an electrical signal is mounted on an electric circuit board having electric wiring formed thereon, and an optical waveguide unit in which an optical waveguide as optical wiring for transmitting the optical signal is formed is incorporated in the electronic device or the like.

In the opto-electric hybrid board, light which is emitted from the light-emitting element is required to enter one end surface (light entrance) of a core (optical wiring) of the optical waveguide unit, and light which exits the other end surface (light exit) of the core is required to be received by the light-receiving element. Therefore, it is necessary that the optical element (the light-emitting element or the light-receiving element) and the core be aligned with each other.

Accordingly, methods of aligning the optical element and the core are conventionally proposed. In an exemplary method, an optical waveguide unit is fixed and, under a state in which light is emitted from a light-emitting element to one end surface (light entrance) of a core of the optical waveguide unit while the location of the light-emitting element is changed, the intensity of light which exits from the other end surface (light exit) of the core is monitored, and the location at which the intensity becomes the highest is determined as the alignment location (see JP-A1-HEI5 (1993)-196831).

However, in the aligning method described in JP-A1-HEI5 (1993)-196831 above, although alignment with high accuracy is possible, it takes time and effort, and thus, the method lacks mass-productivity.

SUMMARY OF THE INVENTION

An opto-electric hybrid board is provided which eliminates the necessity of an aligning operation of a core of an optical waveguide unit and an optical element of an electric circuit unit and which is excellent in mass-productivity. A manufacturing method therefor is also provided.

An opto-electric hybrid board is provided, including: an optical waveguide unit; an electric circuit unit having an optical element mounted thereon; and a coupling pin for coupling the optical waveguide unit and the electric circuit unit to each other, in which: the optical waveguide unit includes: an undercladding layer; a core for an optical path, which is formed on a surface of the undercladding layer; an overcladding layer which covers the core; and a fitting hole for fitting the coupling pin thereinto, which is formed in a surface of the overcladding layer; the electric circuit unit includes: an electric circuit board; the optical element mounted at a predetermined portion on the electric circuit board; and a fitting through hole for fitting the coupling pin therethrough, which is formed in the electric circuit board; the fitting hole in the optical waveguide unit is located and formed at a predetermined location with respect to an end surface of the core; the fitting through hole in the electric circuit unit is located and formed at a predetermined location with respect to the optical element; and the optical waveguide unit and the electric circuit unit are coupled to each other in a state in which the coupling pin fits through the fitting through hole in the electric circuit unit and fits into the fitting hole in the optical waveguide unit.

Further, there is provided a manufacturing method for an opto-electric hybrid board in which an optical waveguide unit and an electric circuit unit having an optical element mounted thereon are coupled using a coupling pin, the method including: manufacturing the optical waveguide unit including: forming an undercladding layer; forming, on a surface of the undercladding layer, a core for an optical path; and forming an overcladding layer so as to cover the core, the forming an overcladding layer including forming a fitting hole for fitting the coupling pin thereinto at a predetermined location located with respect to an end surface of the core; manufacturing the electric circuit unit including: forming an electric circuit board; and mounting the optical element at a predetermined portion on the electric circuit board, the forming an electric circuit board including forming a fitting through hole for fitting the coupling pin therethrough, at a predetermined location located with respect to an expected mounting location of the optical element; and coupling the optical waveguide unit and the electric circuit unit to manufacture the opto-electric hybrid board, the coupling including fitting the coupling pin through the fitting through hole in the electric circuit unit and fitting the coupling pin into the fitting hole in the optical waveguide unit.

In the opto-electric hybrid board, the optical waveguide unit and the electric circuit unit having the optical element mounted thereon are coupled using the coupling pin. In the optical waveguide unit, the end surface of the core and the fitting hole for fitting the coupling pin thereinto are in a positional relationship of being located with respect to each other. Further, in the electric circuit unit, the optical element and the fitting through hole for fitting the coupling pin therethrough are in a positional relationship of being located with respect to each other. Therefore, in the state in which the coupling pin fits through the fitting through hole in the electric circuit unit and fits into the fitting hole in the optical waveguide unit, that is, in the state in which the optical waveguide unit and the electric circuit unit are coupled to each other, the core of the optical waveguide unit and the optical element of the electric circuit unit are automatically aligned. Further, as described above, in the opto-electric hybrid board, the core and the optical element are automatically aligned by a simple operation of fitting the coupling pin through the fitting through hole in the electric circuit unit and fitting into the fitting hole in the optical waveguide unit, and thus an aligning operation which takes time and effort is not necessary and the opto-electric hybrid board is excellent in mass-productivity.

In particular, in the case where the fitting hole in the overcladding layer is formed so as to pass through the overcladding layer, the communicating hole which coaxially communicates with the fitting hole is formed in the surface of the undercladding layer, and the coupling pin also fits into the communicating hole, the coupling pin fits into the fitting hole and the communicating hole, and thus, misalignment of the optical waveguide unit with respect to the electric circuit unit is prevented with higher reliability, and thus the alignment between the core and the optical element may be maintained with higher reliability.

Further, the manufacturing method for an opto-electric hybrid board is carried out by coupling the optical waveguide unit and the electric circuit unit having the optical element mounted thereon by using the coupling pin. In the step of manufacturing the optical waveguide unit, the fitting hole for fitting the coupling pin thereinto is formed at a predetermined location located with respect to the end surface of the core. Further, in the step of manufacturing the electric circuit unit, the fitting through hole for fitting the coupling pin therethrough is formed at a predetermined location located with respect to the optical element. Therefore, by fitting the coupling pin through the fitting through hole in the electric circuit unit and fitting the coupling pin into the fitting hole in the optical waveguide unit to couple the optical waveguide unit and the electric circuit unit to each other, the core of the optical waveguide unit and the optical element of the electric circuit unit may be automatically aligned and the alignment may be performed easily. Further, the core and the optical element may be automatically aligned by such a simple operation, and thus an aligning operation which takes time and effort is not necessary and the method is excellent in mass-productivity.

In particular, in the step of forming the undercladding layer, in the surface of the undercladding layer, the communicating hole which communicates with the fitting hole is formed coaxially with the expected fitting hole forming location of the overcladding layer. In the step of forming the overcladding layer, the fitting hole is formed so as to pass through the overcladding layer. In the step of coupling the optical waveguide unit and the electric circuit unit using the coupling pin, when the coupling pin is also fitted into the communicating hole, the coupling pin is fitted into the fitting hole and the communicating hole, and thus, misalignment of the optical waveguide unit with respect to the electric circuit unit may be prevented with higher reliability.

DETAILED DESCRIPTION OF THE INVENTION

Next, an embodiment of the present invention is described in detail with reference to the drawings.

Figure 1A:
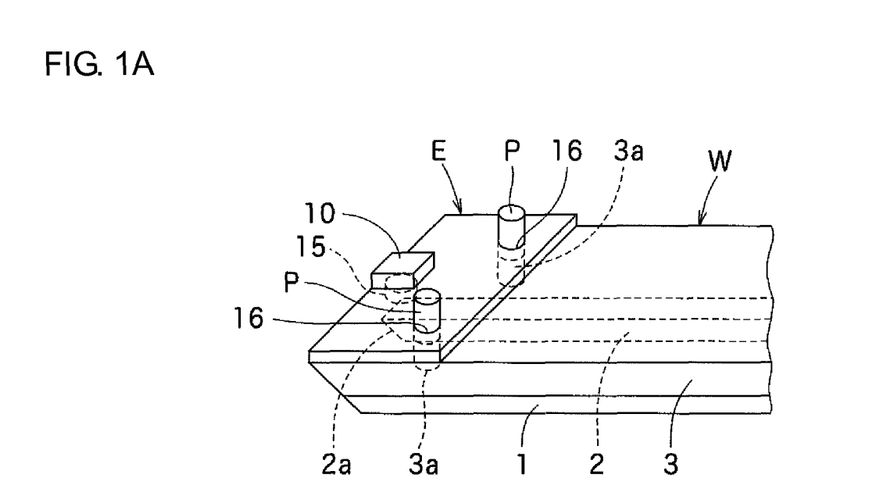
FIG. 1A is a perspective view schematically illustrating an embodiment of an opto-electric hybrid board.
Figure 1B:
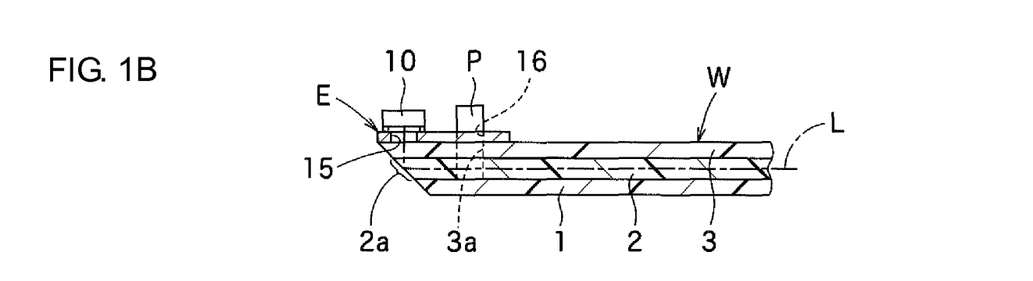
FIG. 1B is a longitudinal sectional view of FIG. 1A.
Figure 2:
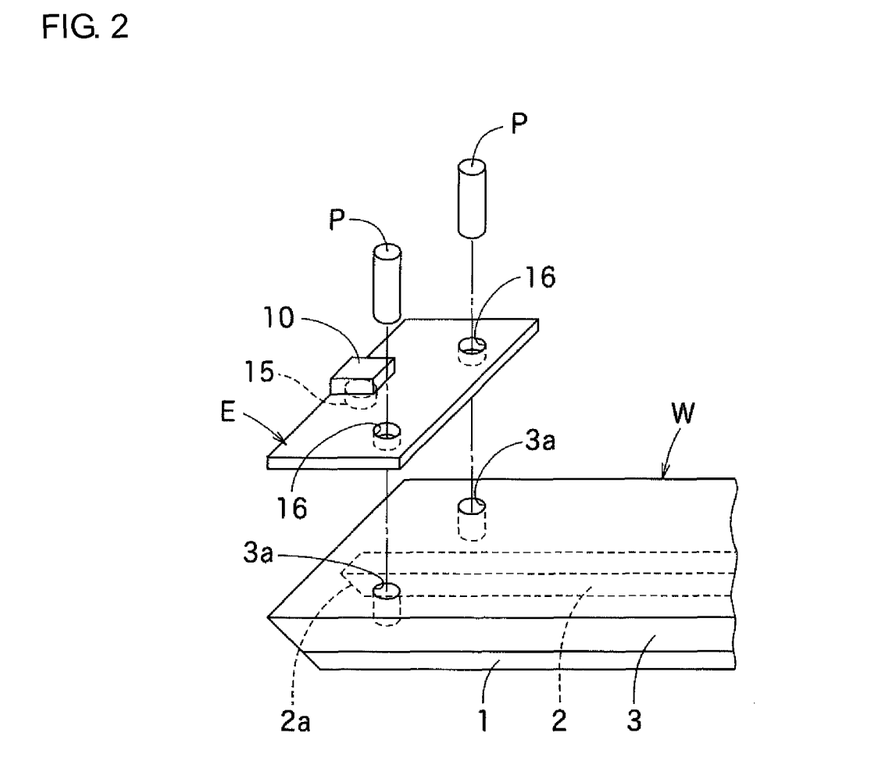
FIG. 2 is an exploded perspective view of the opto-electric hybrid board.

FIG. 1A is a perspective view schematically illustrating an embodiment of an opto-electric hybrid board. FIG. 1B is a longitudinal sectional view and FIG. 2 is an exploded perspective view of the opto-electric hybrid board. In the opto-electric hybrid board, an optical waveguide unit W having fitting holes 3a into which coupling pins fit, an electric circuit unit E having fitting through holes 16 for fitting coupling pins therethrough, and coupling pins P are separately manufactured, and the optical waveguide unit W and the electric circuit unit E are coupled to be integral by fitting the coupling pins P through the fitting through holes 16 in the electric circuit unit E and by fitting the coupling pins P into the fitting holes 3a in the optical waveguide unit W, respectively. Here, in the optical waveguide unit W, the fitting holes 3a are located and formed at predetermined locations with respect to one end surface (inclined surface) 2a of a core 2 (at locations which are set in advance so that, when the units W and E are coupled, light may be transmitted between the one end surface 2a of the core 2 of the optical waveguide unit W and an optical element 10 of the electric circuit unit E). Further, in the electric circuit unit E, the fitting through holes 16 are located and formed at predetermined locations with respect to the optical element 10 (at locations which are set in advance so that, when the units W and E are coupled, light may be transmitted between the optical element 10 of the electric circuit unit E and the one end surface 2a of the core 2 of the optical waveguide unit W). Therefore, in the opto-electric hybrid board, by fitting the coupling pins P through the fitting through holes 16 in the electric circuit unit E and fitting the coupling pins P into the fitting holes 3a in the optical waveguide unit W, respectively, the one end surface 2a of the core 2 and the optical element 10 are automatically and appropriately located in an aligned state. Specifically, the one end surface 2a of the core 2 reflects an optical signal which passes through the core 2, and the optical signal is passed through an overcladding layer 3 and is received by the optical element (light-receiving element) 10 via a through hole 15 for an optical path. An optical signal which is emitted from the optical element (light-emitting element) 10 follows the reverse route. In this way, light may be transmitted between the core 2 and the optical element 10. In FIG. 1B, a dot-and-dash line L indicates a light transmission path, indicating that the light transmission is made without a loss owing to the alignment as described above.

Figure 3A:
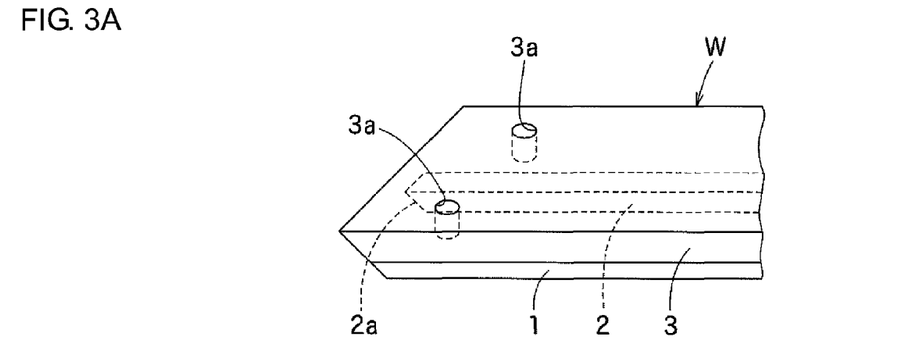
FIG. 3A is a perspective view schematically illustrating an optical waveguide unit which forms the opto-electric hybrid board.
Figure 3B:
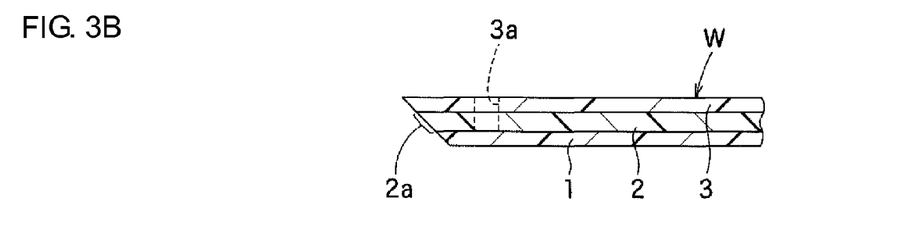
FIG. 3B is a longitudinal sectional view of FIG. 3A.

Description is made in more detail. The optical waveguide unit W includes an undercladding layer 1, the core 2 for an optical path formed on a surface of the undercladding layer 1 in a predetermined linear pattern, and the overcladding layer 3 formed on the surface of the undercladding layer 1 so as to cover the core 2 as illustrated in FIG. 3A as a perspective view and in FIG. 3B as a longitudinal sectional view. Further, one end edge (left end edge in FIGS. 3A and 3B) of the optical waveguide unit W is formed as an inclined surface which is inclined 45° with respect to an axial direction of the core 2, and the one end surface 2a of the core 2 which is located at the inclined surface is a light reflecting surface. The fitting holes 3a for fitting the coupling pins thereinto are formed in a surface of the overcladding layer 3 in a state of being located at predetermined locations with respect to the one end surface 2a of the core 2. In this embodiment, the fitting holes 3a are formed so as to be circular columnar holes and so as to pass through the overcladding layer 3, and two fitting holes 3a are formed so as to be symmetric with respect to the core 2. The two fitting holes 3a are located and formed at predetermined locations with respect to the one end surface (light reflecting surface) 2a of the core 2.

Figure 4A:
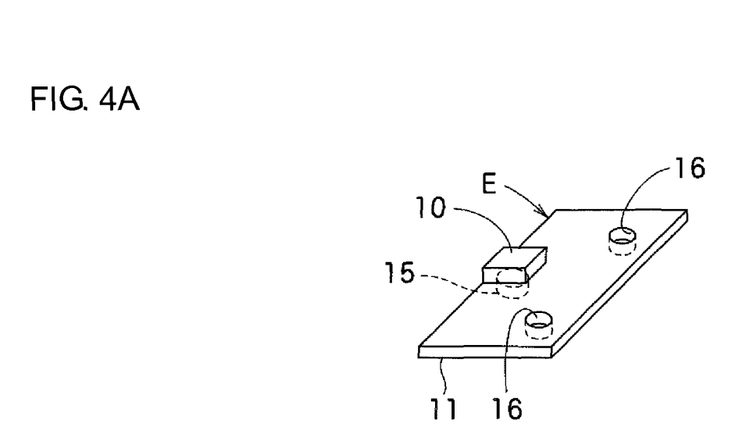
FIG. 4A is a perspective view schematically illustrating an electric circuit unit which forms the opto-electric hybrid board.
Figure 4B:
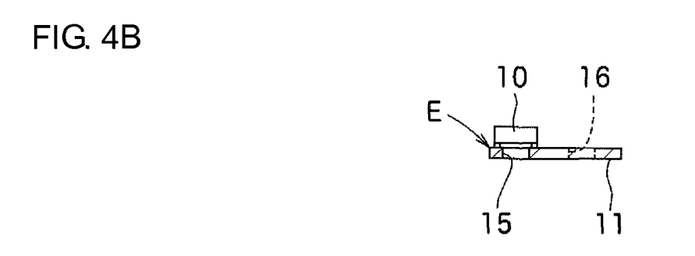
FIG. 4B is a longitudinal sectional view of FIG. 4A.

Meanwhile, the electric circuit unit E includes, as illustrated in FIG. 4A as a perspective view and in FIG. 4B as a longitudinal sectional view, a substrate 11, an insulating layer (not shown) formed on a surface of the substrate 11, an electric circuit (not shown) which is formed on a surface of the insulating layer and which includes a pad for mounting the optical element, and the optical element 10 mounted on the pad for mounting the optical element. Further, the electric circuit unit E has the through hole 15 for the optical path formed therein at a portion corresponding to the optical path of the optical element 10 (under the optical element 10 in FIGS. 4A and 4B). Further, the electric circuit unit E has the fitting through holes 16 formed therein for fitting the coupling pins therethrough in a state of being located at predetermined locations with respect to the optical element 10. The fitting through holes 16 are circular and the inside diameter thereof is the same as that of the fitting holes 3a (see FIGS. 3A and 3B) of the optical waveguide unit W.

Note that, together with the electric circuit including the pad for mounting the optical element, fitting through hole locating circuits (not shown) used as guides (alignment marks) when the fitting through holes 16 are located and formed are formed on the surface of the insulating layer. The fitting through hole locating circuits are formed at locations corresponding to the fitting through holes 16. Further, a plating layer (not shown) is formed on surfaces of the pad for mounting the optical element, the electric circuit, and the fitting through hole locating circuit. In this embodiment, a flip chip type element is used as the optical element 10, and a light-emitting portion or a light-receiving portion thereof is formed on a surface on a mounting side of the optical element 10 (lower surface in FIGS. 4A and 4B).

Further, in this embodiment, as illustrated in FIGS. 1A, 1B, and 2, the coupling pins P are formed so as to be circular column, and the outside diameter thereof is the same as the inside diameter of the fitting holes 3a in the optical waveguide unit W and the inside diameter of the fitting through holes 16 in the electric circuit unit E. Further, the forming material for the coupling pins P is, for example, a resin or a metal.

In the opto-electric hybrid board, as illustrated in FIGS. 1A and 1B, the optical waveguide unit W and the electric circuit unit E are coupled to be integral in a state in which the coupling pins P are fitted through the fitting through holes 16 in the electric circuit unit E and fitted into the fitting holes 3a in the optical waveguide unit W. Here, as described above, the fitting holes 3a formed in the optical waveguide unit W are located and formed in advance at the predetermined locations with respect to the one end surface 2a of the core 2. Further, the fitting through holes 16 formed in the electric circuit unit E are located and formed in advance at the predetermined locations with respect to the optical element 10. Therefore, by fitting the coupling pins P through the fitting through holes 16 and into the fitting holes 3a, the fitting holes 3a and the fitting through holes 16 are located coaxially, and as a result of the locations, the one end surface 2a of the core 2 and the optical element 10 are appropriately located in an aligned state automatically.

The opto-electric hybrid board is manufactured through the following steps (1) to (3):
(1) a step of manufacturing the optical waveguide unit W (see FIGS. 5A to 5E);
(2) a step of manufacturing the electric circuit unit E (see FIGS. 6A to 6E); and
(3) a step of coupling the optical waveguide unit W to the electric circuit unit E by the coupling pins P (see FIG. 2).

<(1) Step of Manufacturing Optical Waveguide Unit W>

The step of manufacturing the optical waveguide unit W of the above-mentioned item (1) is described. First, a plate-like base 20 (see FIG. 5A) used when the undercladding layer 1 is formed is prepared. The forming material for the base 20 is, for example, glass, quartz, silicon, a resin, or a metal. Among them, a substrate formed of a stainless steel is preferred, because a substrate formed of a stainless steel is excellent in resistance to expansion and contraction due to heat and various dimensions thereof are substantially maintained at design values in the process of manufacturing the optical waveguide unit W. Further, the thickness of the base 20 is set within a range of, for example, 20 μm to 1 mm.

Figure 5A:
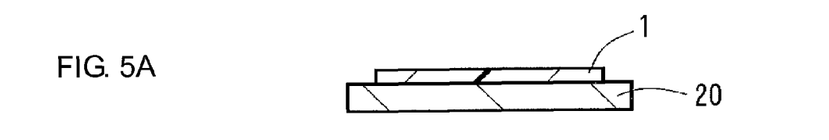
FIGS. 5A to 5E are explanatory views schematically illustrating manufacturing steps for the optical waveguide unit in a manufacturing method for the opto-electric hybrid board.

Next, as illustrated in FIG. 5A as a transverse sectional view, the undercladding layer 1 is formed by photolithography in a predetermined region on a surface of the base 20. As the forming material for the undercladding layer 1, a photosensitive resin such as a photosensitive epoxy resin is used. The thickness of the undercladding layer 1 is set within a range of, for example, 5 to 50 μm.

Figure 5B:
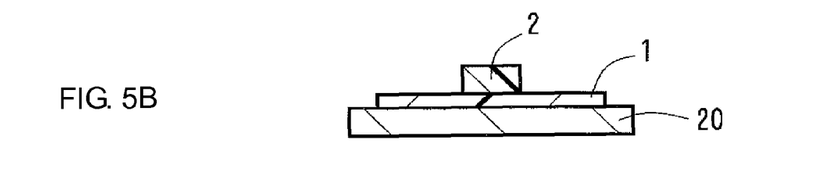

Next, as illustrated in FIG. 5B as a transverse sectional view, the core 2 in the predetermined pattern and the alignment mark (not shown) are simultaneously formed on the surface of the undercladding layer 1 by photolithography. Specifically, the core 2 and the alignment mark are in a positional relationship of being located with respect to each other.

The forming materials for the core 2 and the alignment mark are, for example, a photosensitive resin similar to the case of the undercladding layer 1, and a material having the refractive index higher than those of forming materials for the undercladding layer 1 and the overcladding layer 3 (see FIG. 5C) is used. The adjustment of the refractive index may be made by, for example, selecting the kinds of and adjusting the composition ratios of the forming materials for the undercladding layer 1, the core 2, and the overcladding layer 3. The number of the cores may be one or more than one (one in the case illustrated in FIG. 5B). The pattern of the core 2 is, for example, in the shape of a straight line, branched, or crossed, or may be a combination thereof (in the shape of a straight line in the case illustrated in FIG. 5B). The thickness of the core 2 is set within a range of, for example, 20 to 100 μm. The width of the core 2 is set within a range of, for example, 20 to 100 μm.

Figure 5C:
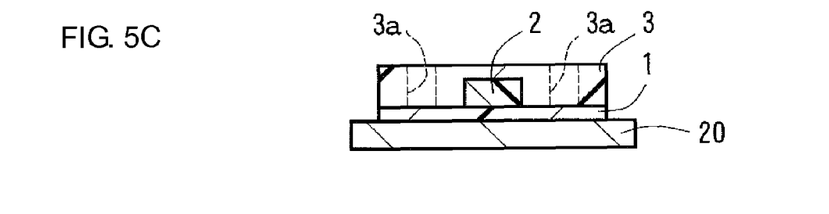

Then, as illustrated in FIG. 5C as a transverse sectional view, the overcladding layer 3 having the fitting holes 3a formed therein and having translucency is formed by photolithography on the surface of the undercladding layer 1 so as to cover the core 2. Specifically, a photomask used in forming the overcladding layer 3 is patterned so that, when the photomask is located with reference to the alignment mark formed in the step of forming the core 2, the portions to be formed as the fitting holes 3a are not exposed to radiation. The forming material for the overcladding layer 3 is, for example, a photosensitive resin similar to the case of the undercladding layer 1. The thickness of the overcladding layer 3 (thickness from the surface of the undercladding layer 1) is set within a range of, for example, a thickness greater than the thickness of the core 2 and a thickness of 1,000 μm or smaller. Further, the inside diameter of the fitting holes 3a is set within a range of, for example, 0.25 to 5.0 mm.

Figure 5D:
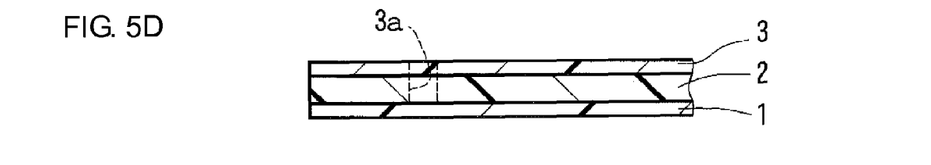
Figure 5E:
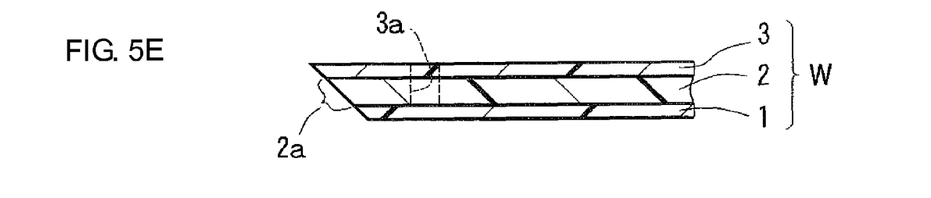

Then, as illustrated in FIG. 5D as a longitudinal sectional view, the base 20 (see FIG. 5C) is separated from a rear surface of the undercladding layer 1. After that, as illustrated in FIG. 5E as a longitudinal sectional view, one end of a laminate including the undercladding layer 1, the core 2, and the overcladding layer 3 is formed into the inclined surface which is inclined 45° with respect to an axial direction of the core 2 by cutting using a rotary blade, laser processing, or the like at a predetermined location with reference to the alignment mark. In this way, the optical waveguide unit W including the undercladding layer 1, the core 2, and the overcladding layer 3 and having the fitting holes 3a for fitting the coupling pins formed in the surface of the overcladding layer 3 is obtained. The thickness of the optical waveguide unit W is set within a range of, for example, 30 to 1,150 μm. Here, both the one end surface 2a of the core 2 located at the inclined surface and the fitting holes 3a of the overcladding layer 3 are formed at the predetermined locations with reference to the alignment mark, and thus, are in a positional relationship of being located with respect to each other. In this way, the step of manufacturing the optical waveguide unit W of the above-mentioned item (1) is completed.

<(2) Step of Manufacturing Electric Circuit Unit E>

Next, the step of manufacturing the electric circuit unit E of the above-mentioned item (2) is described. First, the substrate 11 (see FIG. 6A) is prepared. The forming material for the substrate 11 is, for example, a metal. Among them, a substrate formed of a stainless steel is preferred from the viewpoint of easy processability and dimensional stability. Further, the thickness of the substrate 11 is set within a range of, for example, 0.02 to 0.1 mm.

Figure 6A:
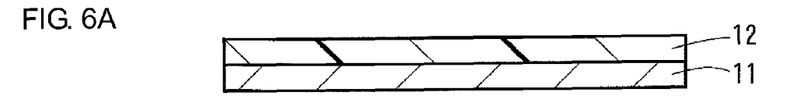
FIGS. 6A to 6E are explanatory views schematically illustrating manufacturing steps for the electric circuit unit in the manufacturing method for the opto-electric hybrid board.

Then, as illustrated in FIG. 6A as a longitudinal sectional view, an insulating layer 12 is formed in a predetermined region of the surface of the substrate 11. With regard to the formation of the insulating layer 12, for example, varnish in which a photosensitive resin such as a photosensitive polyimide resin for forming an insulating layer is dissolved in a solvent is applied, and then, as necessary, the layer formed by applying the varnish is dried by heating treatment to form a photosensitive resin layer for forming the insulating layer. Then, by exposing the photosensitive resin layer to a radiation ray such as an ultraviolet ray via a photomask, the insulating layer 12 in a predetermined shape is formed. The thickness of the insulating layer 12 is set within a range of, for example, 5 to 15 μm.

Figure 6B:
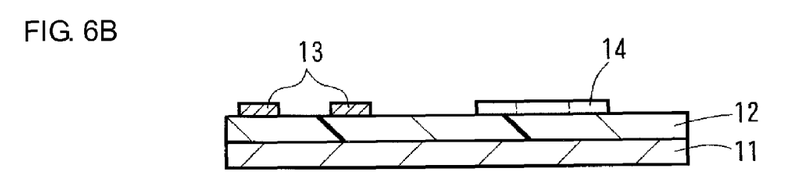

Then, as illustrated in FIG. 6B as a longitudinal sectional view, the electric circuit (not shown) including a pad 13 for mounting the optical element and the ring-like fitting through hole locating circuit 14 are simultaneously formed on a surface of the insulating layer 12, to thereby manufacture an electric circuit board. The formation of the electric circuit and the like is carried out by, for example, a semi-additive process.

More specifically, first, a metal layer (having a thickness of about 60 to 260 nm) is formed on the surface of the insulating layer 12 by sputtering, electroless plating, or the like. The metal layer becomes a seed layer when electrolytic plating is applied later (layer to be a base metal when an electrolytic plating layer is formed). Then, after photosensitive resists are laminated to both surfaces of a laminate including the substrate 11, the insulating layer 12, and the seed layer, hole portions of the pattern of the electric circuit and the like are simultaneously formed by photolithography in the photosensitive resist on a side having the seed layer formed thereon, and surface portions of the seed layer are exposed at the bottom of the hole portions. Then, an electrolytic plating layer (having a thickness of about 5 to 20 μm) is stacked by electrolytic plating on the surface portions of the seed layer exposed at the bottom of the hole portions. Then, the photosensitive resists are separated by a sodium hydroxide solution or the like. After that, portions of the seed layer which do not have the electrolytic plating layer formed thereon are removed by soft etching, and a stacked portion including the remaining electrolytic plating layer and the seed layer thereunder is formed into the electric circuit and the like. In this way, the electric circuit board is obtained, which includes the substrate 11, the insulating layer 12, the electric circuit including the pad 13 for mounting the optical element, and the fitting through hole locating circuits 14.

Figure 6C:
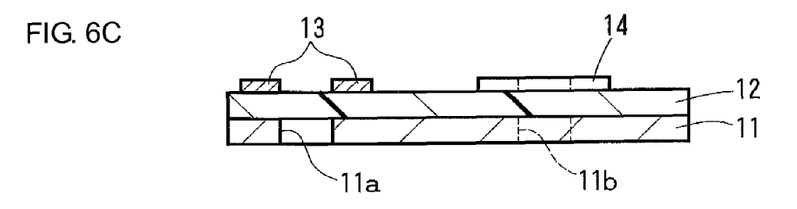

Then, the electric circuit board is set in an exposure machine, and an image of a front surface side (electric circuit side) and an image of a rear surface side (substrate 11 side) are taken by a camera. Based on the images, the locations of expected fitting through hole forming portions on the rear surface side are appropriately located with the ring-like fitting through hole locating circuits 14 on the front surface side being used as guides, and the location of an expected through hole forming portion for the optical path on the rear surface side is appropriately located with the pad 13 for mounting the optical element being used as a guide. Then, a portion of the rear surface side except for the circular expected fitting through hole forming portions and the circular expected through hole forming portion for the optical path is covered with a dry film resist (not shown). Then, as illustrated in FIG. 6C as a longitudinal sectional view, the exposed portions of the substrate 11 at the expected circular fitting through hole forming portions and the expected circular through hole forming portion are removed by etching using a ferric chloride solution. The etching exposes the portions of the insulating layer 12 from portions 11a and 11b removed by the etching.

Figure 6D:
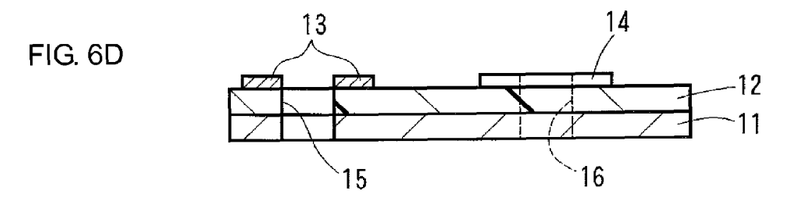

Then, as illustrated in FIG. 6D as a longitudinal sectional view, the exposed portions of the insulating layer 12 are removed by etching using a chemical etchant. This forms the expected circular fitting through hole forming portions into the circular fitting through holes 16 and forms the expected circular through hole forming portion into the circular through hole 15. The fitting through holes 16 are formed with reference to the ring-like fitting through hole locating circuits 14 which are formed simultaneously with the pad 13 for mounting the optical element by the semi-additive process, and thus the fitting through holes 16 are located and formed at predetermined locations with respect to the pad 13 for mounting the optical element. The inside diameter of the fitting through holes 16 is set to be the same as the inside diameter of the fitting holes 3a (see FIG. 1) in the optical waveguide unit W.

Then, by performing electrolytic plating processing, a plating layer is formed on surfaces of the electric circuit including the pad 13 for mounting the optical element and the fitting through hole locating circuits 14. After that, the dry film resist is separated by a sodium hydroxide solution or the like. Note that, examples of the component of the plating layer include gold, nickel, or the like. Further, the thickness of the plating layer is ordinarily set within a range of, for example, 0.2 to 0.5 μm.

Figure 6E:
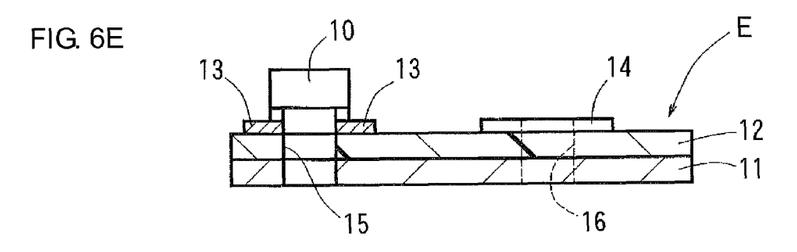

Then, as illustrated in FIG. 6E as a longitudinal sectional view, the optical element 10 is mounted on a surface of the pad 13 for mounting the optical element via the plating layer. After that, as necessary, the optical element 10 and a portion therearound are encapsulated in resin (not shown). In this way, the electric circuit unit E including the fitting through holes 16 is obtained. Here, as described above, the fitting through holes 16 formed in the step illustrated in FIG. 6D are located and formed at the predetermined locations with respect to the pad 13 for mounting the optical element. Therefore, the optical element 10 mounted on the pad 13 for mounting the optical element and the fitting through holes 16 are in a positional relationship of being located with respect to each other. In this way, the step of manufacturing the electric circuit unit E of the above-mentioned item (2) is completed.

<(3) Step of Coupling Optical Waveguide Unit W and Electric Circuit Unit E>

Next, the step of coupling the optical waveguide unit W and the electric circuit unit E is described. In this coupling, as illustrated in FIG. 2, the coupling pins P are manufactured in advance, and the coupling pins P are fitted through the fitting through holes 16 in the electric circuit unit E and fitted into the fitting holes 3a in the optical waveguide unit W to integrate the optical waveguide unit W and the electric circuit unit E. After that, as necessary, the optical waveguide unit W and the electric circuit unit E may be fixed using an adhesive, adhesive tape, or the like. In this way, the step of coupling the optical waveguide unit W and the electric circuit unit E of the above-mentioned item (3) is completed, and the opto-electric hybrid board is completed which is the goal.

Here, as described above, in the optical waveguide unit W, the one end surface 2a of the core 2 and the fitting holes 3a for fitting the coupling pins thereinto are in a positional relationship of being located with respect to each other. Further, in the electric circuit unit E having the optical element 10 mounted thereon, the optical element 10 and the fitting through holes 16 for fitting the coupling pins therethrough are in a positional relationship of being located with respect to each other. Therefore, when the coupling pins P are fitted through the fitting through holes 16 and fitted into the fitting holes 3a as described above to manufacture the opto-electric hybrid board, the one end surface 2a of the core 2 and the optical element 10 are automatically aligned. As a result, in manufacturing the opto-electric hybrid board, an aligning operation which takes time and effort is not necessary. In other words, the opto-electric hybrid board is excellent in mass-productivity.

Figure 7:
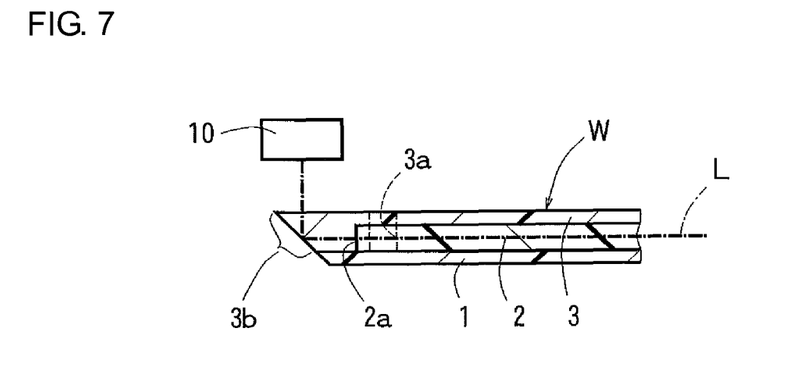
FIG. 7 is an enlarged longitudinal sectional view schematically illustrating a modification example of an end of the optical waveguide unit.

Note that, in the above-mentioned embodiment, at the inclined surface of the one end surface of the optical waveguide unit W, the one end surface 2a of the core 2 which is positioned at the inclined surface is formed into the light reflecting surface, but, as illustrated in FIG. 7 as a longitudinal sectional view of a principal part of the one end, an inclined surface may be formed at one end of the overcladding layer 3 and a portion 3b of the overcladding layer 3 which is positioned at the inclined surface may be formed as a light reflecting surface so that light may be transmitted between the core 2 and the optical element 10 (see a dot-and-dash line L in the figure). Specifically, also in this case, the one end surface 2a of the core 2 and the fitting holes 3a are in a positional relationship of being located with respect to each other, and the one end surface 2a of the core 2 is aligned with the optical element 10.

Further, in the above-mentioned embodiment, the coupling pins P are circular column and two coupling pins P are used, but the coupling pins P may be polygonal column, for example, may be triangular column or quadrangular column, and the shape of openings of the fitting holes 3a and of the fitting through holes 16 may be polygonal columnar holes accordingly. This prevents rotation of the optical waveguide unit W and the electric circuit unit E with respect to the coupling pin P about the coupling pin P, and thus, it is possible to use only one coupling pin P.

Further, in the above-mentioned embodiment, in the optical waveguide unit W, the fitting holes 3a into which the coupling pins P fit are formed so as to pass through the overcladding layer 3, but the fitting holes 3a may be formed so as not to pass through the overcladding layer 3.

Further, in the above-mentioned embodiment, the fitting holes 3a into which the coupling pins P fit are formed only in the overcladding layer 3, but the fitting holes 3a may be formed also in the undercladding layer 1. Specifically, communicating holes which coaxially communicate with the fitting holes 3a formed in the overcladding layer 3 may be formed in the surface of the undercladding layer 1. Further, the coupling pins P may fit also into the communicating holes. The communicating holes may pass through the undercladding layer 1 or the communicating holes may not pass through the undercladding layer 1.

Further, in the above-mentioned embodiment, description is made with regard to one end of the opto-electric hybrid board, but the other end may have a structure which is similar to that of the one end of the above-mentioned embodiment. In this case, as the optical element 10, by, for example, mounting a light-emitting element on the one end side and mounting a light-receiving element on the other end side, light from the light-emitting element may be received by the light-receiving element via the core 2.

Further, in the above-mentioned embodiment, in the manufacturing steps for the electric circuit unit E, the plating layer is formed on the surfaces of the pad 13 for mounting the optical element, the electric circuit, and the fitting through hole locating circuit 14, but the plating layer is formed as necessary, and is not required to be formed when unnecessary.

Next, examples are described. However, the present invention is not limited to the examples.

EXAMPLES

Forming Materials for Undercladding Layer and Overcladding Layer

Component A (solid epoxy resin): epoxy resin including an aromatic ring skeleton (EPICOAT 1002 manufactured by Mitsubishi Chemical Corporation)
70 parts by weight Component B (solid epoxy resin): epoxy resin including an alicyclic skeleton (EHPE3150 manufactured by Daicel Chemical Industries Ltd.) 30 parts by weight Component C (photoacid generator): triarylsulfonium salt, 50% solution in propylene carbonate (CPI-200K manufactured by San-Apro Ltd.)
2 parts by weight Those Components A to C were dissolved in 55 parts by weight of ethyl lactate (produced by Musashino Chemical Laboratory, Ltd.) through agitation (temperature at 80° C. and agitation of 250 rpm for 3 hours) to prepare the undercladding layer and overcladding layer forming material (photosensitive resin composition). The viscosity of the photosensitive resin composition was measured using a digital viscometer (HBDV-I+CP manufactured by Brookfield Engineering Laboratories). The viscosity was 1,320 mPa·s.

Forming Material for Core

Component D: o-cresol novolak glycidyl ether (YDCN-700-10 manufactured by Nippon Steel Chemical Co., Ltd)
100 parts by weight This Component D and 1 part by weight of the above-mentioned Component C were dissolved in 60 parts by weight of ethyl lactate (produced by Musashino Chemical Laboratory, Ltd.) through agitation (temperature at 80° C. and agitation of 250 rpm for 3 hours) to prepare the core forming material (photosensitive resin composition). The viscosity of the photosensitive resin composition was measured using the digital viscometer. The viscosity was 1,900 mPa·s.

Example 1

Manufacture of Optical Waveguide Unit

The above-mentioned undercladding layer, core, and overcladding layer forming materials were used to manufacture the optical waveguide unit having circular columnar fitting holes for fitting coupling pins thereinto similarly to the case of the above-mentioned embodiment. The thickness of the undercladding layer was 25 µm, the thickness of the core was 50 µm, and the thickness of the overcladding layer (thickness from the surface of the undercladding layer) was 75 µm. With regard to the dimensions of the fitting holes, the inside diameter was 2.0 mm and the depth was 75 µm.

Manufacture of Electric Circuit Unit

Similarly to the case of the above-mentioned embodiment, the electric circuit unit was manufactured, which included the substrate made of a stainless steel (having a thickness of 55 µm), the insulating layer (having a thickness of 10 µm), the electric circuit and the fitting through hole locating circuits having the plating layer formed thereon (having a thickness of 12.5 µm including the plating layer), and the fitting through holes for fitting the coupling pins therethrough. The inside diameter of the fitting through holes was 2.0 mm. Note that, as the optical element, a light-emitting element of a flip chip type (ULM850-10-TT-C0104U manufactured by U-L-M Photonics) was mounted. Further, after the optical element was mounted, underfill encapsulation of the optical element was performed with a transparent resin (LED encapsulating resin NT-8038 manufactured by NITTO DENKO CORPORATION).

Manufacture of Coupling Pins

By injecting the forming material for the undercladding layer into a mold which was made of a metal and designed in a predetermined shape (by molding), circular columnar coupling pins made of an epoxy resin were manufactured. With regard to the dimensions of the coupling pins, the outside diameter was 2.0 mm and the length was 1.0 mm.

Manufacture of Opto-Electric Hybrid Board

The coupling pins were fitted through the fitting through holes in the electric circuit unit and fitted into the fitting holes in the optical waveguide unit, respectively, to integrate the optical waveguide unit and the electric circuit unit. After that, the two were fixed using an adhesive.

Light Propagation Test

A current was caused to flow through the light-emitting element of the opto-electric hybrid board of Example 1 and light was caused to exit from the light-emitting element. It was confirmed that light exited from the other end of the core of the opto-electric hybrid board.

Example 2

Manufacture of Optical Waveguide Unit

An optical waveguide unit was manufactured, which was the optical waveguide unit of Example 1 with the other end having, similarly to the one end, fitting holes for fitting coupling pins thereinto. Other portions of Example 2 were formed similarly to those of Example 1.

Manufacture of Electric Circuit Unit

An electric circuit unit similar to the one in Example 1 was manufactured. Further, the electric circuit unit formed was the electric circuit unit in Example 1 having, instead of the light-emitting element, a light-receiving element of a flip chip type (PDCA04-70-GS manufactured by Albis Optoelectronics) mounted thereon.

Manufacture of Opto-Electric Hybrid Board

Similarly to the case of Example 1, the electric circuit unit having the light-emitting element mounted thereon was fixed to one end of the optical waveguide unit and the electric circuit unit having the light-receiving element mounted thereon was fixed to the other end of the optical waveguide unit.

Signal Transmission Test

A current was caused to flow through the light-emitting element of the opto-electric hybrid board of Example 2, and light was caused to exit from the light-emitting element. It was confirmed that the light was received by the light-receiving element.

From the result of Examples 1 and 2 above, it can be found that, in the manufacturing method described above, even without an aligning operation of the core of the optical waveguide unit and the optical element (light-emitting element or light-receiving element) of the electric circuit unit, the obtained opto-electric hybrid board may appropriately propagate light.

The opto-electric hybrid board according to the present invention may be used in an information-communication device, a signal processing device, or the like, which transmits and processes at high speed a digital audio signal, a digital image signal, or the like.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board, comprising:
   an optical waveguide unit;
   an electric circuit unit having an optical element mounted thereon; and
   a coupling pin for coupling the optical waveguide unit and the electric circuit unit to each other,
   wherein the optical waveguide unit comprises:
      an undercladding layer;
      a core for an optical path, the core being formed on a surface of the undercladding layer;
      an overcladding layer which covers the core; and
      a fitting hole for fitting the coupling pin thereinto, the fitting hole being formed in a surface of the overcladding layer;
   wherein the electric circuit unit comprises:
      an electric circuit board;
      the optical element mounted at a predetermined portion on the electric circuit board; and a fitting through hole for fitting the coupling pin therethrough, the fitting through hole being formed in the electric circuit board;

wherein one end edge of the optical waveguide is formed as an inclined light reflecting surface which is inclined 45° with respect to an axial direction of the core so that light reflected by the light reflecting surface can be transmitted between the core and the optical element;

wherein the fitting hole in the optical waveguide unit is located and formed at a predetermined location with respect to an end surface of the core;

wherein the fitting through hole in the electric circuit unit is located and formed at a predetermined location with respect to the optical element;

wherein the shape and size of a cross-section of the coupling pin, which is at a right angle to an axis of the coupling pin, are identical to the shapes and sizes of cross-sections of the fitting through hole and the fitting hole, which are at a right angle to the axes of the fitting through hole and the fitting hole;

wherein the optical waveguide unit and the electric circuit unit are coupled to each other in a state in which the coupling pin fits through the fitting through hole in the electric circuit unit and fits into the fitting hole in the optical waveguide unit, wherein the coupling pin and the electric circuit board are in direct contact with each other, wherein the electric circuit board is disposed directly on the overcladding layer of the optical waveguide unit, and wherein the coupling pin and the overcladding layer are in direct contact with each other.

2. The opto-electric hybrid board according to claim 1, wherein the fitting hole in the overcladding layer is formed so as to pass through the overcladding layer;

wherein the surface of the undercladding layer has a communicating hole formed therein, communicating hole coaxially communicates with the fitting hole; and wherein the coupling pin also fits into the communicating hole.

3. A manufacturing method for an opto-electric hybrid board in which an optical waveguide unit and an electric circuit unit having an optical element mounted thereon are coupled using a coupling pin, the method comprising:

manufacturing the optical waveguide unit comprising:
forming an undercladding layer;
forming, on a surface of the undercladding layer, a core for an optical path; and
forming an overcladding layer so as to cover the core, the forming an overcladding layer comprising forming a fitting hole for fitting the coupling pin thereinto at a predetermined location located with respect to an end surface of the core;

after forming the overcladding layer, forming one end edge of the optical waveguide as an inclined light reflecting surface which is inclined 45° with respect to an axial direction of the core, manufacturing the electric circuit unit comprising:
forming an electric circuit board; and
mounting the optical element at a predetermined portion on the electric circuit board, the forming an electric circuit board comprising forming a fitting through hole for fitting the coupling pin therethrough, at a predetermined location located with respect to an expected mounting location of the optical element;

forming the shape and size of a cross-section of the coupling pin, which is at a right angle to an axis of the coupling pin, to be identical to the shapes and sizes of the cross-sections of the fitting through hole and the fitting hole, which are at a right angle to axes of the fitting through hole and the fitting hole;

coupling the optical waveguide unit and the electric circuit unit, the coupling comprising fitting the coupling pin through the fitting through hole in the electric circuit unit and fitting the coupling pin into the fitting hole in the optical waveguide unit, wherein the coupling pin and the electric circuit board are in direct contact with each other, wherein the electric circuit board is disposed directly on the overcladding layer of the optical waveguide unit, and wherein the coupling pin and the overcladding layer are in direct contact with each other.

4. The manufacturing method for an opto-electric hybrid board according to claim 3, wherein the forming of the undercladding layer comprises forming, in the surface of the undercladding layer, a communicating hole which communicates with the fitting hole, so as to be formed coaxially with an expected fitting hole forming location of the overcladding layer;

wherein the forming of the overcladding layer comprises forming the fitting hole so as to pass through the overcladding layer; and wherein the coupling of the optical waveguide unit and the electric circuit unit using the coupling pin comprises fitting the coupling pin also into the communicating hole.

* * * * *